United States Patent
Zeng et al.

(10) Patent No.: US 10,873,262 B2
(45) Date of Patent: *Dec. 22, 2020

(54) SEMICONDUCTOR CHIP POWER SUPPLY SYSTEM

(71) Applicant: Delta Electronics (Shanghai) CO., LTD, Shanghai (CN)

(72) Inventors: Jianhong Zeng, Shanghai (CN); Haoyi Ye, Shanghai (CN); Xiaoni Xin, Shanghai (CN); Siyu He, Shanghai (CN); Xinjian Zou, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/808,662

(22) Filed: Mar. 4, 2020

(65) Prior Publication Data

US 2020/0204078 A1 Jun. 25, 2020

Related U.S. Application Data

(63) Continuation of application No. 16/122,844, filed on Sep. 5, 2018, now Pat. No. 10,630,181.

(30) Foreign Application Priority Data

Sep. 7, 2017 (CN) .......................... 2017 1 0801528

(51) Int. Cl.
| | |
|---|---|
| *H02M 1/08* | (2006.01) |
| *H02M 1/36* | (2007.01) |
| *H02M 3/335* | (2006.01) |
| *H03K 5/24* | (2006.01) |
| *H02M 3/158* | (2006.01) |
| *G06F 1/28* | (2006.01) |
| *H01L 25/065* | (2006.01) |

(52) U.S. Cl.
CPC ............ *H02M 3/1584* (2013.01); *G06F 1/28* (2013.01); *H01L 25/0655* (2013.01); *H02M 1/08* (2013.01); *H02M 3/1588* (2013.01)

(58) Field of Classification Search
CPC ... H02M 3/1584; H02M 1/08; H01L 25/0655; G06F 1/28
See application file for complete search history.

(56) References Cited

U.S. PATENT DOCUMENTS

| | | | | |
|---|---|---|---|---|
| 7,102,305 | B2 * | 9/2006 | Suzuki ..................... | H02P 21/22 318/400.02 |
| 10,630,181 | B2 * | 4/2020 | Zeng ................... | H02M 3/1584 |
| 2018/0226894 | A1 * | 8/2018 | Teo .......................... | H02M 1/08 |

\* cited by examiner

*Primary Examiner* — Kenneth B Wells
(74) *Attorney, Agent, or Firm* — Yunling Ren

(57) ABSTRACT

The present disclosure provides a semiconductor chip power supply system, including: a semiconductor chip including: a first data processing function area and a first power converter control area, the first data processing function area and the first power converter control area being formed on a first semiconductor substrate of the semiconductor chip; and a first power converter power stage located outside the first semiconductor substrate and electrically connected to the first power converter control area and the first data processing function area; wherein the first power converter control area controls the first power converter power stage to supply power to the first data processing function area.

27 Claims, 19 Drawing Sheets

SEMICONDUCTOR CHIP POWER SUPPLY SYSTEM

CROSS REFERENCE TO RELATED APPLICATION

This application is a continuation of U.S. Pat. No. 10,630,181 filed on Sep. 5, 2018, which is based on and claims priority to Chinese Patent Application No. 201710801528.2, filed on Sep. 7, 2017, the entire contents of both of which are incorporated herein by reference.

TECHNICAL FIELD

This disclosure relates to the field of semiconductors, and more particularly, a semiconductor chip power supply system.

BACKGROUND

With the growing computing capability of artificial intelligence, its application fields become more and more wide. In this process, an important development direction of the artificial intelligence is that computing units with different structures and resources are used in parallel for calculation, which requires using a large number of CPUs, GPUs, FPGAs and ASICs. Along with the development of the semiconductor technology, such semiconductor chips will need a higher working frequency, and more current and power consumption due to the physical characteristics thereof.

Therefore, in order to meet the requirements of the semiconductor chip for computing performance and heat dissipation, higher technical requirements are proposed for a DC-DC (Direct current to direct current) power supply module. The DC-DC module needs to provide a processor with a larger current. The DC-DC module provides the power supply voltage to multiple cores of the semiconductor chip separately so as to reduce the power consumption in light load. The DC-DC module rapidly adjusts the power supply voltage so as to reduce the power consumption of the computing core in the idle time.

FIG. 1 is a schematic diagram of a semiconductor chip power supply system according to the related art. As shown in FIG. 1, the semiconductor chip power supply system 1 includes: a semiconductor chip 10 (such as a CPU, GPU, FPGA or ASIC) using a relatively high precision semiconductor manufacturing process A1, such as 14 nm process; a power converter control chip 12 using a relatively low precision semiconductor manufacturing process A2, such as 180 nm process; and a power converter power stage 11 including: switches T1 and T2 and their driver 100, as well as other corresponding passive components, such as an inductor L1, a capacitor C1, and a transformer. The switching frequency of the power converter power stage 11 is generally around 500 KHz, but the present disclosure is not limited thereto. In the semiconductor chip power supply system 1, the power converter power stage 11 supplies power to the semiconductor chip 10 by the controlling of the power converter control chip 12.

In order to meet the power supply demands of the chips in the future, the working frequency of the power converter power stage needs to be greatly improved to meet the higher power density and faster regulation capability, for example, from the current 500 KHz to 2 MHz or even above 10 MHz; also, the power converter control chip must have more rapid control capability, so the process precision A2 also needs to be improved. However, an increase in the process precision A2 often results in a high cost, especially in a case of increasing the process precision A2 to the process precision A1. Besides, the size of an independent power converter control chip is often small, and its market amount is difficult to support the high cost of high-tech semiconductor development. Therefore, at present, the process precision of 14 nm of the semiconductor chips is populated, but the process precision of the power converter control chip generally has not reached 60 nm.

SUMMARY

In view of the above problems, the embodiments of the present disclosure provide a semiconductor chip power supply system which can realize high frequency regulation at low cost with a simple system structure, also with the benefits of reducing size and increasing reliability.

According to a first aspect of the embodiments of the present disclosure, there is provided a semiconductor chip power supply system, including: a semiconductor chip including: a semiconductor chip comprising: a first data processing function area and a first power converter control area, the first data processing function area and the first power converter control area being formed on a first semiconductor substrate of the semiconductor chip; and a first power converter power stage located outside the first semiconductor substrate and electrically connected to the first power converter control area and the first data processing function area; wherein the first power converter control area controls the first power converter power stage to supply power to the first data processing function area, and the first power converter control area receives a signal of an output voltage of the first power converter power stage and adjusts an output voltage of the first power converter power stage according to a working frequency of the first data processing function area; wherein the first power converter power stage comprises: at least a switch, a driver and at least a passive device.

The present disclosure has at least the following advantageous technical effects: because the power converter control area is developed with the semiconductor chip, the process precision of the power converter control area is high with low cost. Moreover, the components of the system also become less, making the system structure more concise, and reliability is therefore improved.

DETAILED DESCRIPTION

The embodiments of the present disclosure will be described in detail below. It should be noted that the embodiments described herein are for illustrative purposes only and are not intended to limit the scope of the present disclosure. Hereinafter, the present disclosure will be described in detail with reference to the accompanying drawings and embodiments. In addition, it should be noted that, in the case of no conflict, the embodiments in the present disclosure and the features in the embodiments may be combined with each other.

First Embodiment

Figure 2:
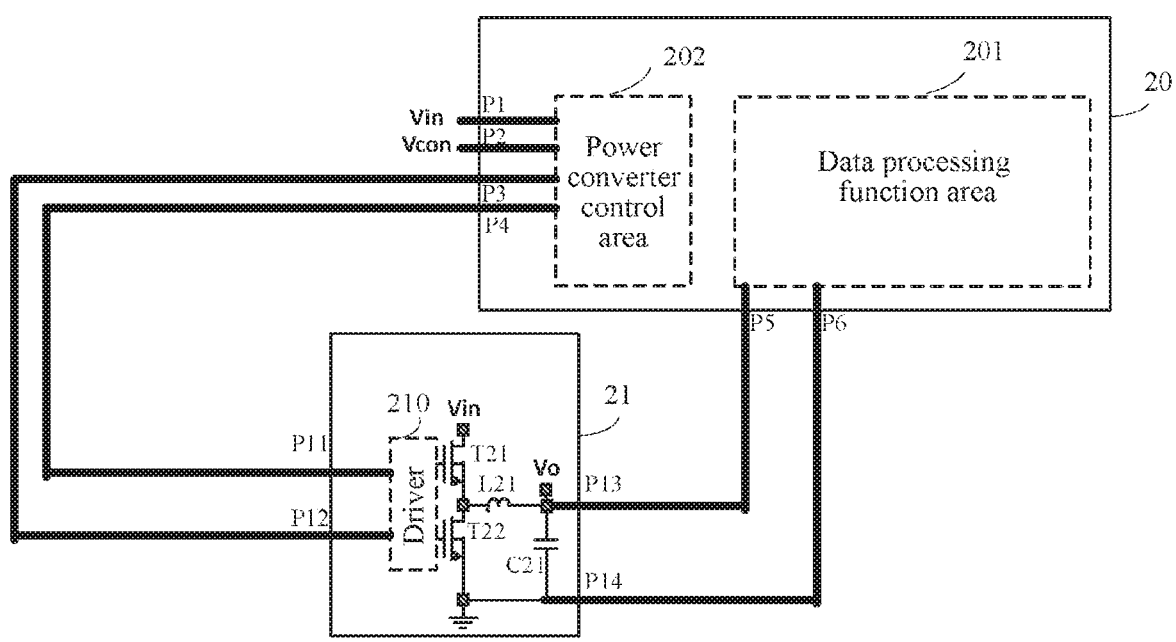
FIG. 2 is a schematic diagram of a semiconductor chip power supply system according to a first embodiment of the present disclosure.

FIG. 2 is a schematic diagram of a semiconductor chip power supply system according to the first embodiment of the present disclosure.

Figure 3:
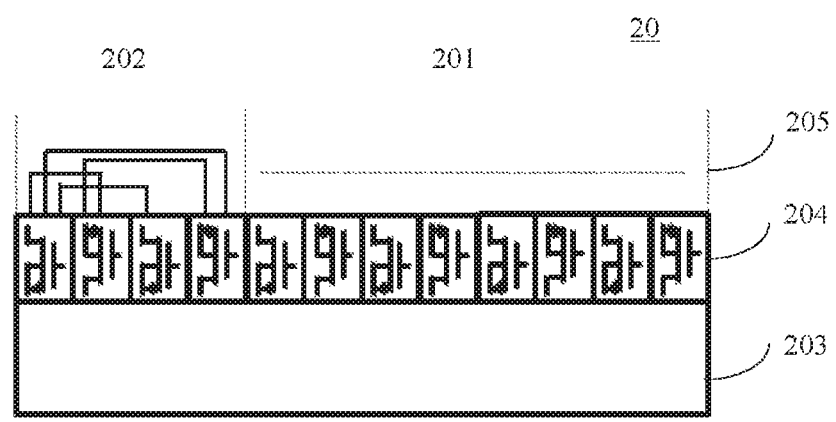
FIG. 3 is a schematic diagram of a physical structure of a semiconductor chip according to an embodiment of the present disclosure.

As shown in FIG. 2, the semiconductor chip power supply system 2 includes: a semiconductor chip 20 and a power converter power stage 21. The semiconductor chip 20 includes: a data processing function area 201 and a power converter control area 202. The data processing function area 201 and the power converter control area 202 are formed on a semiconductor substrate 203 of the semiconductor chip 20 (as shown in FIG. 3). The power converter power stage 21 is located outside the semiconductor substrate and electrically connected to the power converter control area 202 and the data processing function area 201. In the semiconductor chip power supply system 2, the power converter control area 202 controls the power converter power stage 21 to supply power to the data processing function area 201.

In the embodiments of the present disclosure, the data processing function area and the power converter control area are integrated in one semiconductor chip, that is, the power converter control area and the data processing function area, as well as other functional partitions of the semiconductor chip physically belong to the same semiconductor substrate. In addition, the data processing function area and the power converter control area communicate within the chip, such as within an RDL (Redistribution Layer).

By forming both the data processing function area and the power converter control area on the semiconductor substrate of the semiconductor chip, the process precision A1 of the data processing function area may be the same as the process precision A2 of the power converter control area, i.e., the data processing function area and the power converter control area may use the same manufacturing process. The power converter control area is developed along with the semiconductor chip, thereby the process precision of the power converter control area is high, and a high frequency can be achieved at low cost. Moreover, the number of the components of the system is reduced from three main components in FIG. 1 to two main components in FIG. 2, making the system structure more concise, thus reducing system size and improving reliability.

In the present embodiment, the power converter power stage 21 at least includes a switch, a driver 210 and a passive device. The power converter power stage 21 may employ a multi-phase paralleled buck circuit or a switched capacitor circuit, but the present disclosure is not limited thereto.

As shown in FIG. 2, for example, the switch may include switches T21 and T22, and the passive device may include an inductor L21 and a capacitor C21. Drive signal receiving pins P11 and 12 of the driver 210 are electrically connected to drive signal sending pins P4 and P3 of the power converter control area 202, respectively. An output terminal of the driver 210 is electrically connected to control electrodes of the switches 121 and T22. The first electrode of the switch T21 is connected to a second electrode of the switch 122. The second electrode of the switch T21 receives an input voltage Vin. The input voltage Vin may be obtained from an input terminal of the power converter power stage 21. The first electrode of the switch 122 is grounded. A connection point between the switch 121 and the switch 122 is connected to one end of the inductor L21. The other end of the inductor L21 is connected to a power output pin P13 of the power converter power stage 21 to output a voltage Vo, and is connected to one end of the capacitor C21. The other end of the capacitor C21 is connected to a ground pin P14 of the power converter power stage 21 and then is grounded. However, the present disclosure is not limited thereto, and the power converter power stage may adopt other circuit topologies.

In one embodiment, the power converter control area 202 sends a drive signal (for example, a PWM signal and a GND signal) to the drive signal receiving pins P11 and P12 of the power converter power stage 21 via the drive signal sending pins P3 and P4. The driver 210 receives the drive signal from the drive signal receiving pins P11 and P12, and amplifies the drive signal and drives the switches T1 and T2. Then, the switches T1 and T2 cooperate with the passive device (e.g., the inductor L21 and the capacitor C21) to convert the input voltage Vin to the output voltage Vo and provides the output voltage Vo to the data processing function area 201 via the power output pin P13.

In addition, the power converter power stage 21 may provide its working status signal to the power converter control area 202 via a working status signal receiving pin (not shown). The working status signal is, for example, a PG (Power Good) signal, a fault signal, an Over Current Protect (OCP) signal, an Over Temperature Protect (OTP) signal or the like, or is a sampling of the input voltage Vin, an output voltage Vo or the like. These working status signals are provided to the power converter control area 202 so that the power converter control area 202 may control the working status of the power converter power stage 21.

In an embodiment, the drive signal sending pins P3 and P4 of the semiconductor chip 20 may be multiplexed to realize a status signal receiving function, that is, for the same pin, the above-mentioned different functions may be implemented in a time-dividing manner (a time-share manner), so that the number of the pins used by the semiconductor chip 20 can be saved. The drive signal sending pin and the working status signal receiving pin are multiplexed.

The semiconductor chip 20 may further have a first power supply pin P5 and a second power supply pin P2. The first power supply pin P5 is electrically connected to the data processing function area 201 and receives a first voltage (for example, the output voltage Vo) provided by the power converter power stage 21 to supply power to the data processing function area 201. The second power supply pin P2 is electrically connected to the power converter control area 202 and receives a second voltage (e.g., a voltage Vcon from an external power source) to supply power to the power converter control area 202. However, the present disclosure is not limited thereto.

In this embodiment, the power output pin P13 of the power converter power stage 21 is connected to the first power supply pin P5 for providing the power Vo to the data processing function area 201. In addition, the semiconductor chip 20 may further have a ground pin P6, which is connected to a ground pin P14 of the power converter power stage 21 and then is grounded.

The semiconductor chip 20 may also have an input signal pin P1 for receiving a voltage signal of the input voltage Vin of the power converter power stage 21. The semiconductor chip 20 may also receive signal of the output voltage Vo of the power converter power stage 21. This facilitates the power converter control area 202 to better understand the real-time status of the power converter power stage 21, and then realize an accurate and fast output control. The input signal pin P1 may also receive other types of input signals, but the present disclosure is not limited thereto.

The physical structure of the semiconductor chip 20 will be described below with reference to FIG. 3. As shown in FIG. 3, the semiconductor chip 20 includes a semiconductor substrate 203 (e.g., silicon substrate). A transistor layer 204 is formed on the semiconductor substrate 203 by a process such as doping and etching on the semiconductor substrate 203. Transistors in the transistor layer 204 are interconnected through a connection layer 205 to realize the function of the semiconductor chip 20. But the present disclosure is not limited thereto.

Figure 4:
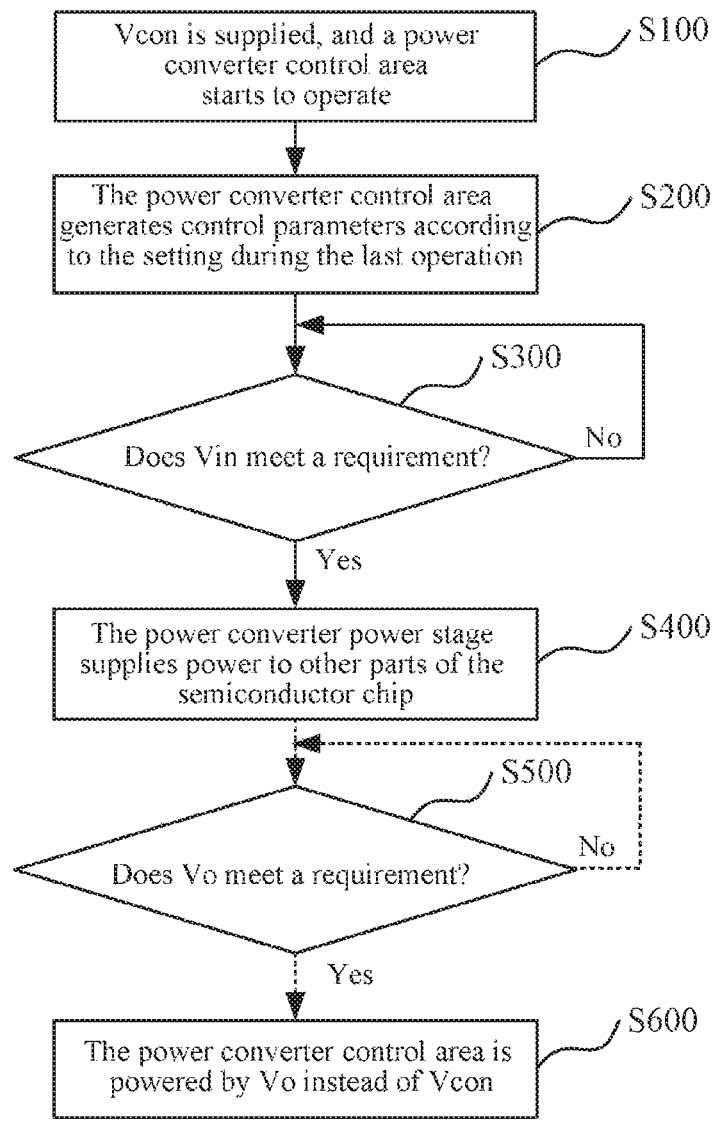
FIG. 4 is a start time sequence diagram of a semiconductor chip power supply system according to an embodiment of the present disclosure.

FIG. 4 is a startup time sequence diagram of a semiconductor chip power supply system according to an embodiment of the present disclosure. With reference to FIGS. 2 and 4, when the semiconductor chip 20 is activated, firstly in step S100, a voltage Vcon is supplied to the power converter control area 202 of the semiconductor chip 20 via the second power supply pin P2. Then, in step S200, the power converter control area 202 generates various types of control parameters according to the initial setting or the setting during the last operation, for controlling the startup of the power converter power stage 21. Before starting the power converter power stage 21, in step S300, the power converter control area 202 determines whether the input voltage Vin inputted to the power converter power stage 21 meets input requirement, for example, whether the input voltage Vin is in a range of 6-10V. If the input voltage Vin does not meet the requirement, then a detection of the input voltage Vin is maintained, waiting for that the input voltage Vin enters into the required range. When the input voltage Vin meets the requirement, the process proceeds to step S400, and the power converter control area 202 controls the power converter power stage 21 to supply power to other parts of the semiconductor chip 20 besides the power converter control area 202.

In an embodiment, the power supply time sequence described above may further include steps S500 and S600, as shown by dotted lines in FIG. 4. In step S500, it is determined Whether the output voltage Vo meets a requirement, for example, whether an amplitude of Vo is within a normal working voltage range of the power converter control area. If the output voltage Vo does not meet the requirement, then the detection of the output voltage Vo is continued to wait for the output voltage Vo falling into the required range. When the output voltage Vo meets the requirement, the process advances to step S600 to supply power to the power converter control area 202 with the voltage Vo instead of Vcon.

According to the above power supply time sequence, the power converter control area of the semiconductor chip is firstly powered by the Vcon and is activated prior to other areas of the semiconductor chip. When the power converter control area is activated and Vin meets the requirement, the power converter control area controls the power converter power stage to output the voltage Vo and thus the power converter power stage powers other areas of the semiconductor chip except the power converter control area.

In this embodiment, the first power supply pin P5 is also electrically connected to the power converter control area 202. After the voltage Vo is greater than a threshold value, the voltage Vo of the first power supply pin P5 supplies power to the power converter control area 202 instead of the voltage Vcon of the second power supply pin P2. That is, if the Vo meets the requirement, the Vo may be used to replace Vcon for powering the power converter control area of the semiconductor chip.

According to an embodiment of the present disclosure, after receiving the Vcon, the power converter control area of the semiconductor chip starts to operate, samples the output voltage Vo or output current, compares it with a target voltage or current, performs some calculations, and then sends a next cycle drive signal, thereby controlling the power converter power stage, so as to make the output voltage reach the target state, such as in start, steady-state, dynamic, overload and other states.

In an embodiment, the circuit of the power converter power stage 21 may select a switched inductor circuit or a switched capacitor circuit according to the requirement for capability of adjusting the output voltage Vo by the semiconductor chip 20. For example, when a precise control of Vo is required for the semiconductor chip 20, the switched inductor circuit may be used, e.g., a buck circuit, whereas the switched capacitor circuit may be used instead.

In an embodiment, the above solution may be applied to a semiconductor chip with a process precision of 28 nm or higher, such as a process precision of 12 nm (the smaller the process precision value is, the higher the accuracy is), and the working frequency of the power converter power stage may be higher than or equal to 1 MHz, or even higher than 5 MHz. In addition, because the advantages of the present disclosure are more obvious at a high frequency, a maximum operation frequency of the semiconductor chip in an embodiment may be above 500 MHz or even above 1 GHz.

Second Embodiment

Figure 1:
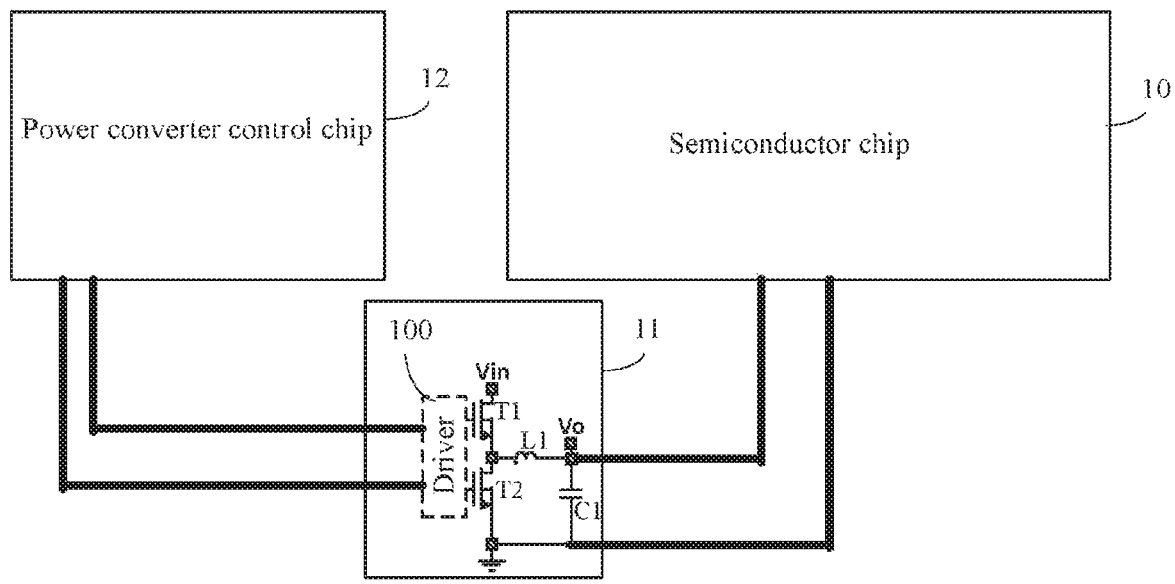
FIG. 1 is a schematic diagram of a semiconductor chip power supply system according to the related art.
Figure 5:
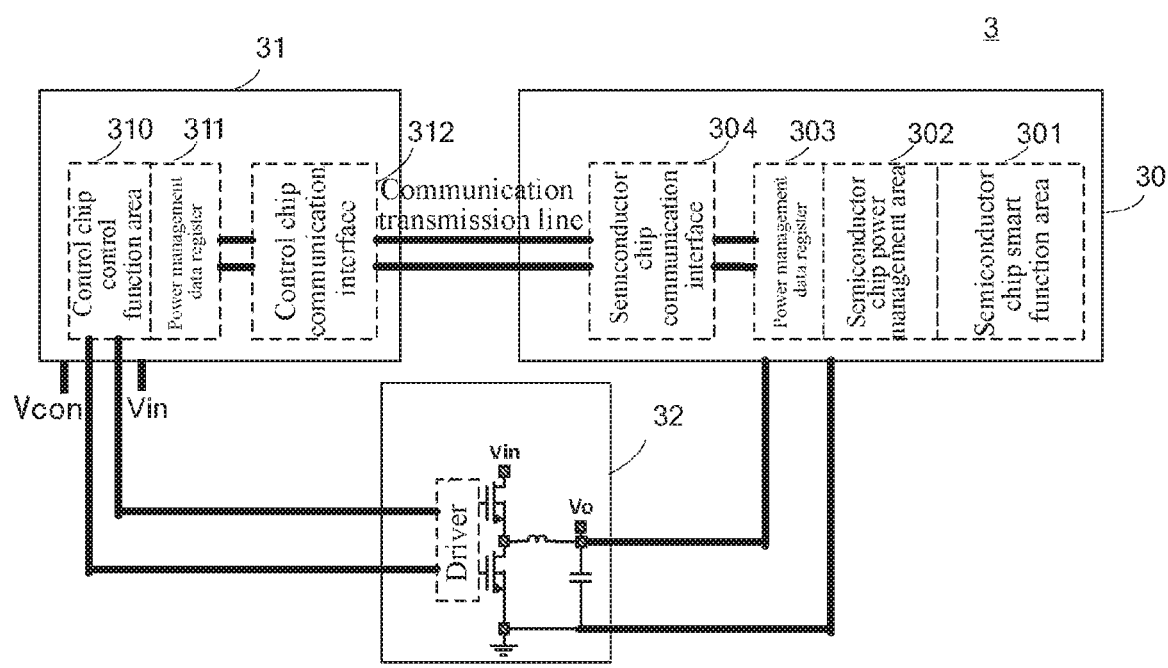
FIG. 5 is a schematic diagram of a semiconductor chip power supply system according to the related art.

FIG. 5 is a schematic diagram of a semiconductor chip power supply system according to the related art. The basis of the semiconductor chip is a variety of function circuits composed of transistors, and working frequency and working voltage of the semiconductor chip have a certain relationship. For example, a semiconductor chip needs a working voltage of 1.0V when operating at a frequency of 3 GHz, and needs a working voltage of 0.8V when operating at a frequency of 300 MHz. As shown in the circuits of FIG. 1 and FIG. 2, no matter the semiconductor chip works under any condition, the voltage of the output voltage Vo is not adjusted accordingly. For example, when the semiconductor chip operates at a frequency of 3 GHz or 300 MHz, the output voltage is always 1.0V, and thus much power is wasted when operating at 300 MHz. Therefore, in some embodiments of the present disclosure, by communicating the semiconductor chip with the power controller, the output voltage of the powerconverter can be provided as needed according to the working condition of the semiconductor chip, thereby saving energy as much as possible.

As shown in FIG. 5, the semiconductor chip power supply system 3 includes: a semiconductor chip 30, a powerconverter control chip 31, and a powerconverter power stage 32. The structure of the power converter powerstage 32 is the same as that of the power converter power stage 11 in FIG. 1, and thus will not be elaborated here.

The semiconductor chip 30 includes: a semiconductor chip smart function area a semiconductor chip power management area 302, a power management data register 303, and a semiconductor chip communication interface 304. The power converter control chip 31 includes: a control chip control function area 310, a power management data register 311, and a control chip communication interface 312. The semiconductor chip communication interface 304 may communicate with the control chip communication interface 312 through a communication transmission line.

The semiconductor chip power management area 302 places a requirement for the output voltage of the power converter control chip 31 (i.e., a power management parameter(s) or a control parameter(s)) into the power management data register 303 according to an operation status of the semiconductor chip smart function area 301. The semiconductor chip communication interface 304 reads the power management parameter from the power management data register 303, modulates the power management parameter into a communication protocol (such as a PMBUS protocol), and then transmits the communication protocol to the control chip communication interface 312 through the PMBUS bus. Then, the control chip communication interface 312 demodulates the communication protocol to obtain the power management parameter and stores it into its power management data register 311. After that, the control chip control function area 310 adjusts the drive signal according to the power management parameter and sends it to the power converter power stage 32, so that the semiconductor chip 30 may obtain the desired power supply Vo.

However, the structure shown in FIG. 5 has several disadvantages.

First of all, the transfer of the control parameter(s) passes through many sectors, so the speed is limited. It is difficult to meet the increasingly high-speed requirement of adjusting the voltage Vo of the semiconductor chip, resulting in the waste of energy.

Second, the communication transmission line is very long, and interferences exist inevitably. The communication is easy to fail, causing maladjustment or system crashes. According to statistics, a large part of the failures in such computing systems are caused by the failure of communication transmission, resulting in great losses.

Figure 6:
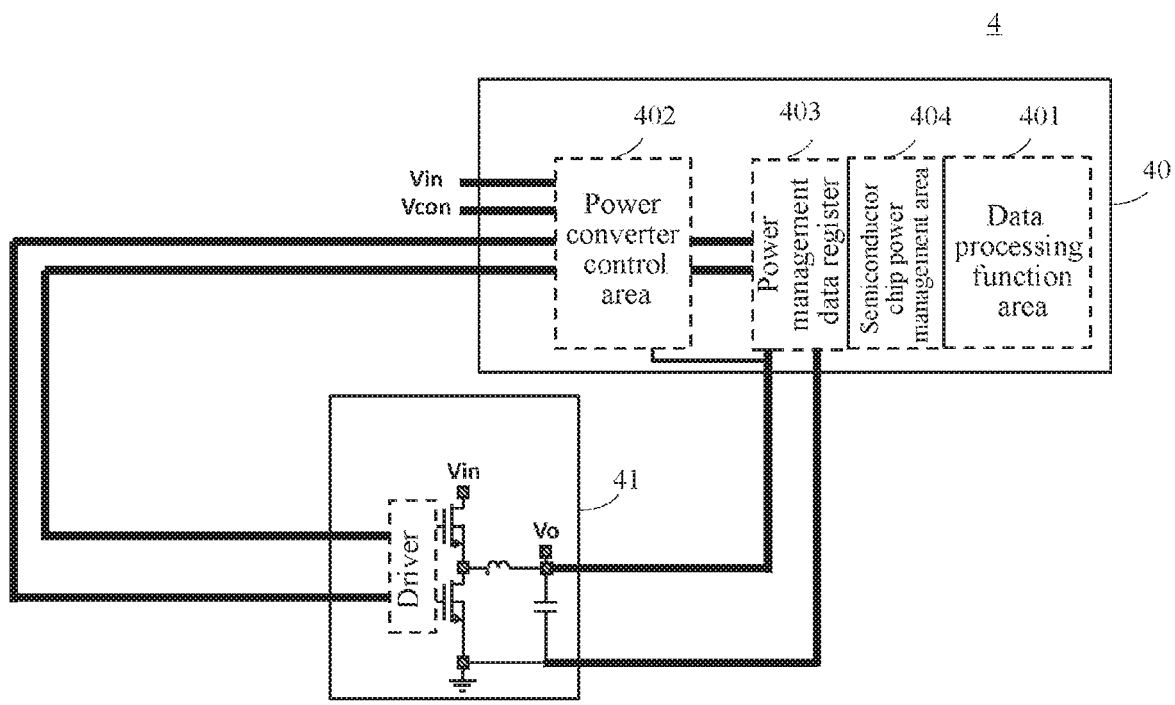
FIG. 6 is a schematic diagram of a modified embodiment according to a second embodiment of the present disclosure.

In view of this, the embodiment shown in FIG. 6 is given in conjunction with the spirit of FIG. 2 of the present disclosure. Compared with FIG. 5, in FIG. 6, the complex communication function part is reduced, which increases the speed, reduces costs, reduces the size, and improves the reliability. The control chip is formed on the semiconductor chip to enable the control chip to be produced by using a high-precision process.

Similar to the structure shown in FIG. 2, the semiconductor chip power supply system 4 as shown in FIG. 6 also includes: a semiconductor chip 40 and a power converter power stage 41. The semiconductor chip 40 includes: a data processing function area 401 and a power converter control area 402. The data processing function area 401 and the power converter control area 402 are formed on a semiconductor substrate of the semiconductor chip 40. The power converter power stage 41 is located outside the semiconductor substrate and electrically connected to the power converter control area 402 and the data processing function area 401 to save costs. In the semiconductor chip power supply system 4, the power converter control area 402 controls the power converter power stage 41 to supply power to the data processing function area 401. Similar components and their connection structures and functions, such as pin arrangements and connections, power supply source conversions of the power converter control area of the chip, may be applied to this embodiment, which will not be elaborated here.

The semiconductor chip power supply system 4 shown in FIG. 6 is different from the semiconductor chip power supply system 2 shown in FIG. 2 in that, as shown in FIG. 6, in the semiconductor chip power supply system 4, the semiconductor chip 40 further includes: a power management data register 403 and a semiconductor chip power management area 404. The power management data register 403 is electrically connected to the semiconductor chip power management area 404, the power management data register 403 is electrically connected to the power converter control area 402 inside the semiconductor chip, the semiconductor chip power management area 404 provides the power converter control area 402 with the required control parameter(s) and the control parameter(s) is stored in the power management data register 403, and the power converter control area 402 regulates the output power supply of the power converter power stage 41 by reading the control parameter(s) in the power management data register 403.

As described above, the semiconductor chip has a semiconductor chip power management function so that it is possible to provide parameters for adjusting the power supply manner of the power converter power stage. The semiconductor chip power converter control area 402 extracts the control parameter(s) within the semiconductor chip 40 and adjusts the drive signal by calculation according to each parameter of the power converter power stage, so that the output Vo of the power converter power stage can meet the requirement of the semiconductor chip.

In an embodiment, the above control parameter(s) may be directly accessed by the semiconductor chip power management function 404 and the semiconductor chip power converter control area 402 through the power management data register 403.

Third Embodiment

For large semiconductor chips, in order to achieve more powerful data processing functions, a chip is often divided into multiple function areas, such as multiple cores. These function areas often work independently. In other words, working conditions of individual function areas may be not the same at the same time. If each of the function areas may be individually powered and adjusted according to individual requirements, the low energy consumption can be achieved to the utmost.

Figure 7:
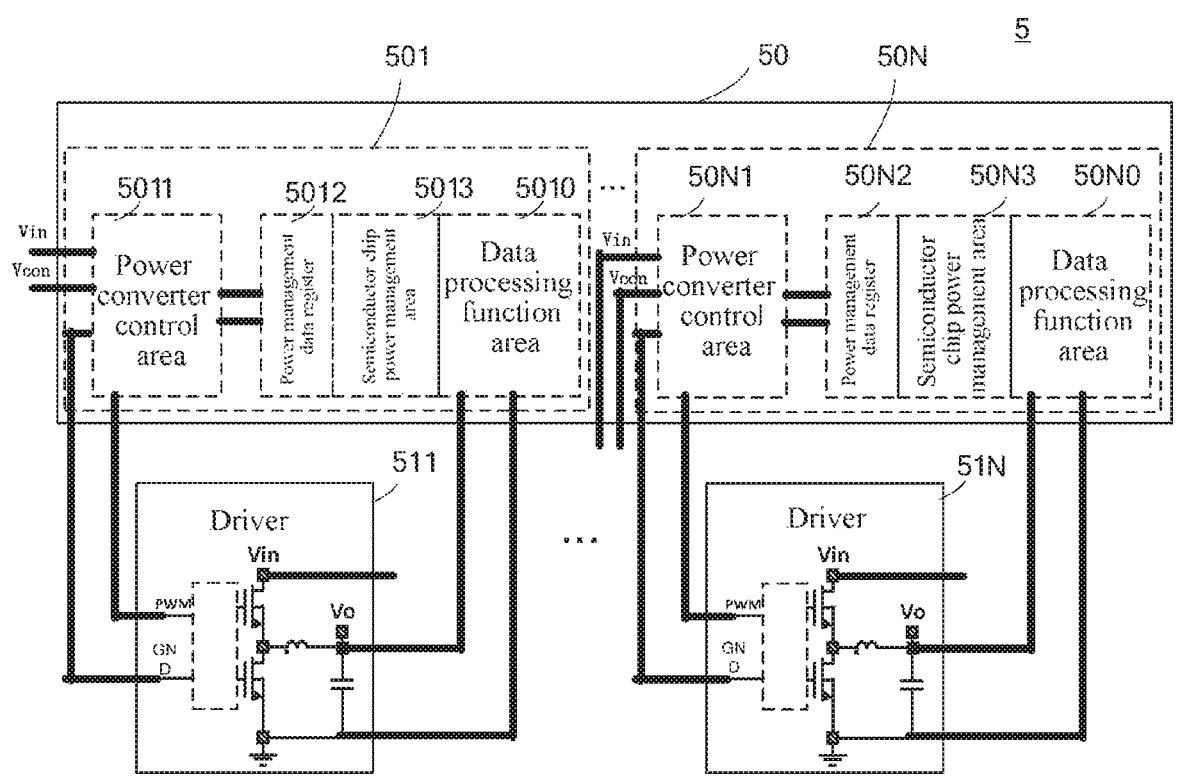
FIG. 7 is a schematic diagram of a semiconductor chip power supply system according to a third embodiment of the present disclosure.

Based on this, the third embodiment of the present disclosure provides an embodiment of a semiconductor chip power supply system as shown in FIG. 7.

As shown in FIG. 7, the semiconductor chip 50 of the semiconductor chip power supply system 5 is divided into N partitions, i.e., a first semiconductor chip partition 501, ..., and $N^{th}$ semiconductor chip partition 50N, where N is an integer greater than or equal to 2. Each semiconductor chip partition may be equivalent to the entire semiconductor chip 20 shown in FIG. 2, i.e., each semiconductor chip partition includes a respective data processing function area and a power converter control area. Alternatively, each semiconductor chip partition may be equivalent to the entire semiconductor chip 40 shown in FIG. 6, i.e., each semiconductor chip partition includes a respective data processing function area, a power converter control area, a power management data register, and a semiconductor chip power management area. However, the present disclosure is not limited thereto. Correspondingly, the semiconductor chip power supply system further includes: N power converter power stages 511-51N. The output voltages and the input voltages of the respective power converter power stages 511-51N may be designed to be the same, but the present disclosure is not limited thereto.

The first semiconductor chip partition 501 includes: a data processing function area 5010 and a power converter control area 5011. Optionally, the first semiconductor chip partition 501 may further include: a power management data register 5012 and a semiconductor chip power management area 5013. The data processing function area 5010 of the first semiconductor chip partition 501 is powered via a power converter power stage 511. The $N^{th}$ semiconductor chip partition 50N includes: a data processing function area 50N0 and a power converter control area 50N1. Alternatively, the $N^{th}$ semiconductor chip partition 50N may further include: a power management data register 50N2 and a semiconductor chip power management area 50N3. The data processing function area 50N0 of the $N^{th}$ semiconductor chip partition 50N is powered via the power converter power stage 51N. The power management data register 50N2 is electrically connected to the semiconductor chip power management area 50N3. The power management data register 50N2 is electrically connected to the power converter control area 50N1 of the $N^{th}$ power converter power stage 51N. The semiconductor chip power management area 50N3 provides the power converter control area 50N1 with the required control parameter(s) and the control parameter(s) is stored in the power management data register 50N2. The power converter control area 50N1 adjusts the output power supply of the $N^{th}$ power converter power stage 51N by reading the control parameter(s) in the power management data register 50N2.

N data processing function areas 5010-50N0 may be independently powered for obtaining a relatively good performance-to-power ratio. Accordingly, the semiconductor chip 50 integrates at least N power converter control areas for adjusting the input voltage Vo of the above N data processing function areas (i.e., the output voltage of the corresponding power converter power stage).

Other components, connection structures and the functions of the foregoing embodiments may be applicable to the present embodiment. For example, the semiconductor chip 50 may further have a third power supply pin and a fourth power supply pin. The third power supply pin is electrically connected to the $N^{th}$ data processing function area 50N0 and receives a third voltage provided by the $N^{th}$ power converter power stage 51N to supply power to the $N^{th}$ data processing function area 50N0. The fourth power supply pin is electrically connected to the $N^{th}$ power converter control area 50N1 and receives a fourth voltage (e.g., from an external power source) to supply power to the $N^{th}$ power converter control area 50N1. The present disclosure is not limited thereto.

Although the corresponding connection relationships of individual pins of the two semiconductor chip partitions 501 and 50N are set to be the same in FIG. 7, the voltages received by individual pins of the two semiconductor chip partitions 501 and 50N may be different, for example, the first voltage received by the semiconductor chip partition 501 may be different from the third voltage received by the semiconductor chip partition 50N, and the second voltage received by the semiconductor chip partition 501 may be different from the fourth voltage received by the semiconductor chip partition 50N. Other elements and their connection structures and functions in the foregoing embodiments, such as a power supply source conversion in the power converter control area of the chip, may be applied to this embodiment, and details are not described herein again.

In an embodiment, the power converter control area, the power management data register, and the semiconductor chip power management area corresponding to the $X^{th}$ semiconductor chip partition (1<=X<=N) are within a physical area of the semiconductor chip partition, and is formed on the same semiconductor substrate of the semiconductor chip, so as to achieve short-range communication, thereby obtaining the best performance.

In an embodiment, N output voltages Vo1-VoN may be independently adjusted in real time according to the working states of the corresponding data processing function areas.

Fourth Embodiment

On the basis of FIG. 7, if the processing speeds of the semiconductor chip power management area and the power management data register are fast enough, one group of semiconductor chip power management area and power management data register may correspond to a plurality of power converter control areas, to achieve time division multiplexing, thereby saving the area of the semiconductor chip occupied by the management area and register. This type of semiconductor chip power supply system will be described below with reference to FIG. 8.

Figure 8:
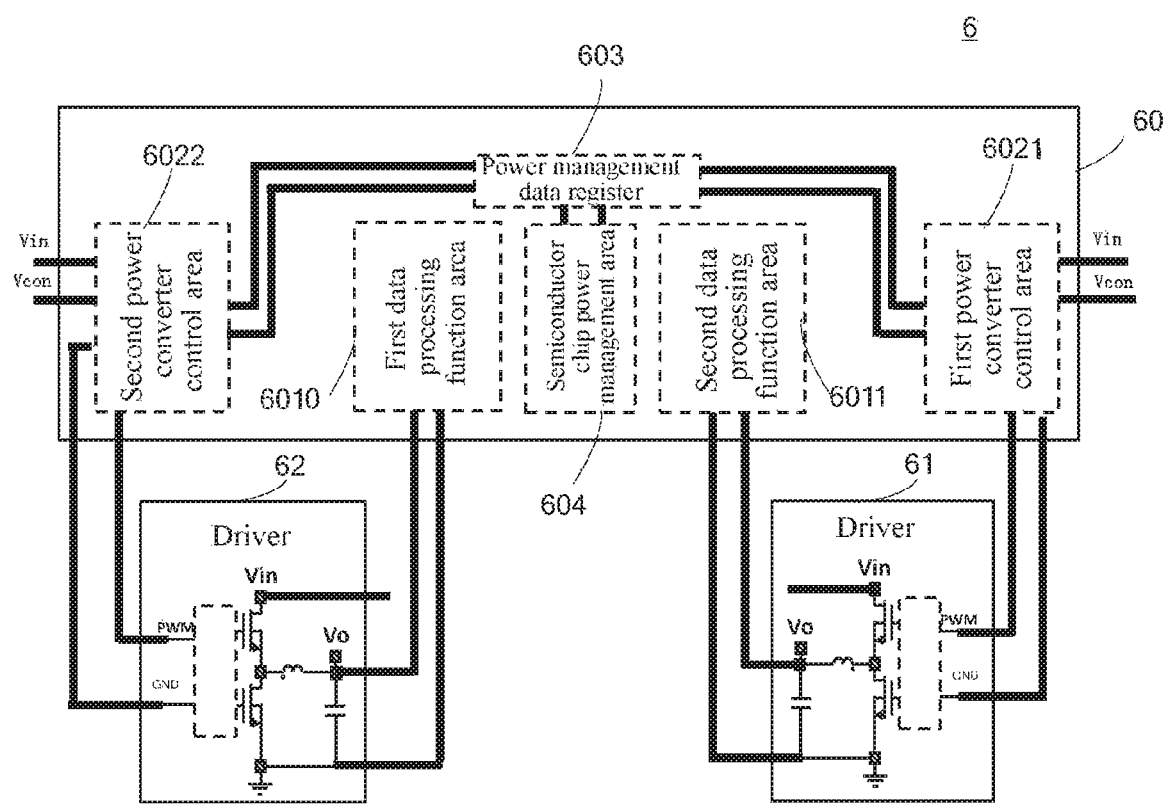
FIG. 8 is a schematic diagram of a semiconductor chip power supply system according to a fourth embodiment of the present disclosure.

As shown in FIG. 8, the semiconductor chip power supply system 6 includes: a semiconductor chip 60 and power converter power stages 61 and 62. The semiconductor chip 60 includes: a first data processing function area 6010, a second data processing function area 6011, a first power converter control area 6021 and a second power converter control area 6022. The semiconductor chip 60 further includes: a power management data register 603 and a semiconductor chip power management area 604. The power management data register 603 is electrically connected to the semiconductor chip power management area 604. The power management data register 603 is electrically connected to the first power converter control area 6021 and the second power converter control area 6022. The semiconductor chip power management area 604 provides control parameter(s) required by the first power converter control area 6021 and the second power converter control area 6022 and stores the control parameter(s) in the power management data register 603, The first power converter control area 6021 and the second power converter control area 6022 read the control parameter(s) in the power management data register 603 to respectively adjust the output power supplies of the first power converter power stage 61 and the second power converter power stage 62.

In the semiconductor chip power supply system 6, the semiconductor chip power management area 604 and the power management data register 603 of the semiconductor chip 60 are connected to the first data processing function area 6010, the second data processing function area 6011, the first power converter control area 6021 and the second power converter control area 6022.

Although only two data processing function areas, two power converter control areas, and two power converter power stages 61 and 62 are shown in FIG. 8, the numbers of such function areas, control areas and power stages may be set according to needs, for example, the number may be N, and N is an integer greater than 1. Thus, N power converter control areas correspond to one group of semiconductor chip power management area(s) and power management data register(s), where N>=2. The present embodiment may also be combined with the above embodiments. For example, a part of the power converter control areas in the chip correspond to one group of semiconductor chip power management area(s) and power management data register(s), and another part of the power converter control areas correspond to the same number of semiconductor chip power management areas and power management data registers respectively. Similar elements and their connection structures and functions, such as pin arrangement and connection, power supply source conversion of power converter control area of the chip, may be applicable to this embodiment, which will not be elaborated here.

Fifth Embodiment

To achieve more powerful computing power, in some semiconductor chips, a plurality of data processing function areas are designed into one group for sharing one task, such as GPU. Therefore, during operation, the computing task is equally distributed to the data processing function areas in the same group, and therefore, the working voltages required by the plurality of data processing function areas in the group are the same. Based on FIG. 6, the present embodiment provides an example of powering multiple data processing function areas through one power converter power stage.

Figure 9:
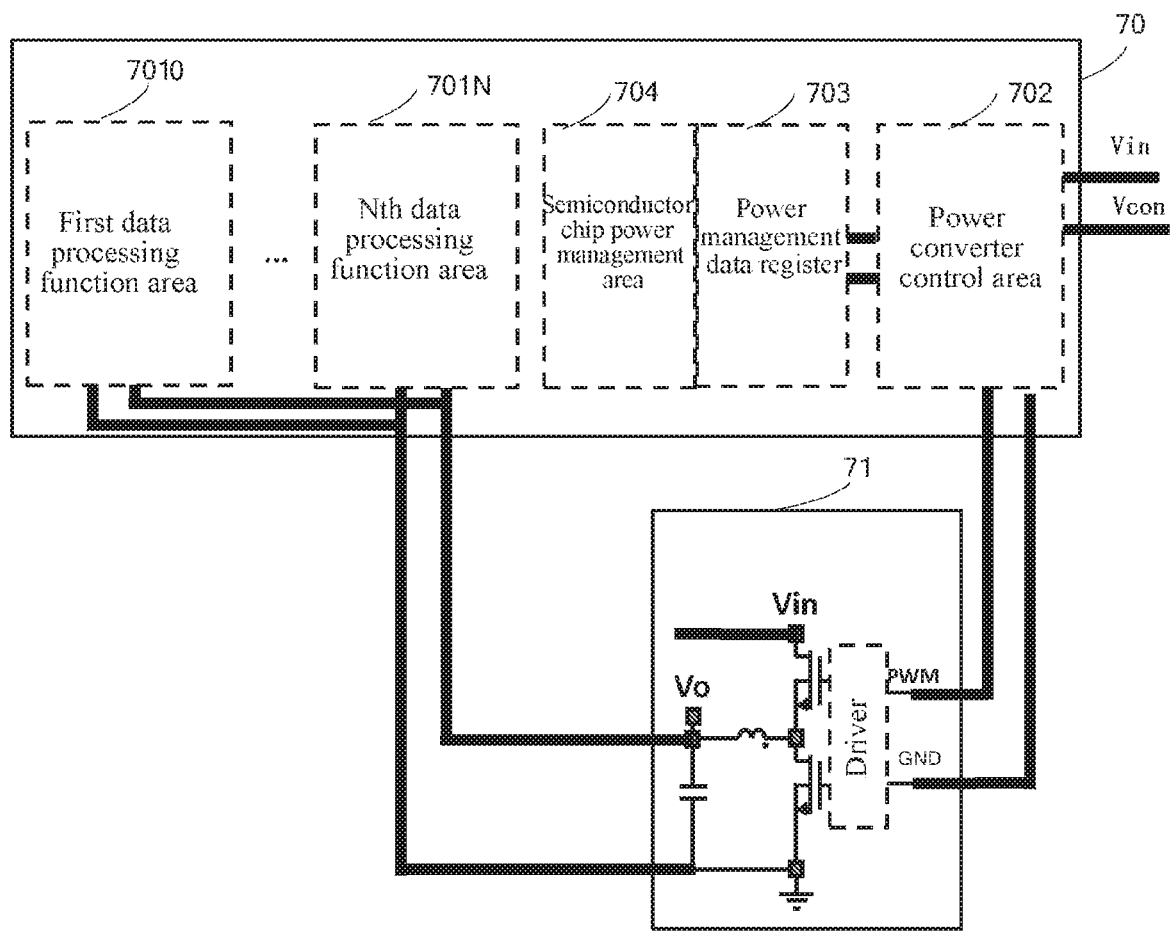
FIG. 9 is a schematic diagram of a semiconductor chip power supply system according to a fifth embodiment of the present disclosure.

As shown in FIG. 9, the semiconductor chip power supply system 7 includes: a semiconductor chip 70 and a power converter power stage 71. The semiconductor chip 70 includes: a first data processing function area 7010 to an $N^{th}$ data processing function area 701N, and a power converter control area 702. Optionally, the semiconductor chip 70 may further include: a power management data register 703 and a semiconductor chip power management area 704. The power management data register 703 is electrically connected to the semiconductor chip power management area 704. The structure of the semiconductor chip 70 in FIG. 9 is similar to that in FIG. 6, and details are not described herein again.

In the semiconductor chip power supply system 7, it is possible to include only one power converter power stage 71 and N semiconductor chip function areas. The N semiconductor chip function areas, that is, data processing function areas, share one power converter power stage. The N data processing function areas may be electrically connected with the output of the power converter power stage through pins respectively. Alternatively, as shown in FIG. 9, the N data processing function areas may be electrically connected with a pin (for example, a first power supply pin) of the semiconductor chip, and then is electrically connected to the power converter power stage through the pin. This embodiment may also be combined with the foregoing embodiments. For example, a part of the data processing function areas in the chip correspond to one power converter power stage, and the other part of the data processing function areas correspond to the same number of power converter power stages respectively. Similar elements and their connection structures and functions, such as pin arrangement and connection, power supply source conversion power converter control area of chip, setting of the semiconductor chip power management areas and power management data registers are all applicable to this embodiment, which will not be elaborated here.

Sixth Embodiment

Figure 10:
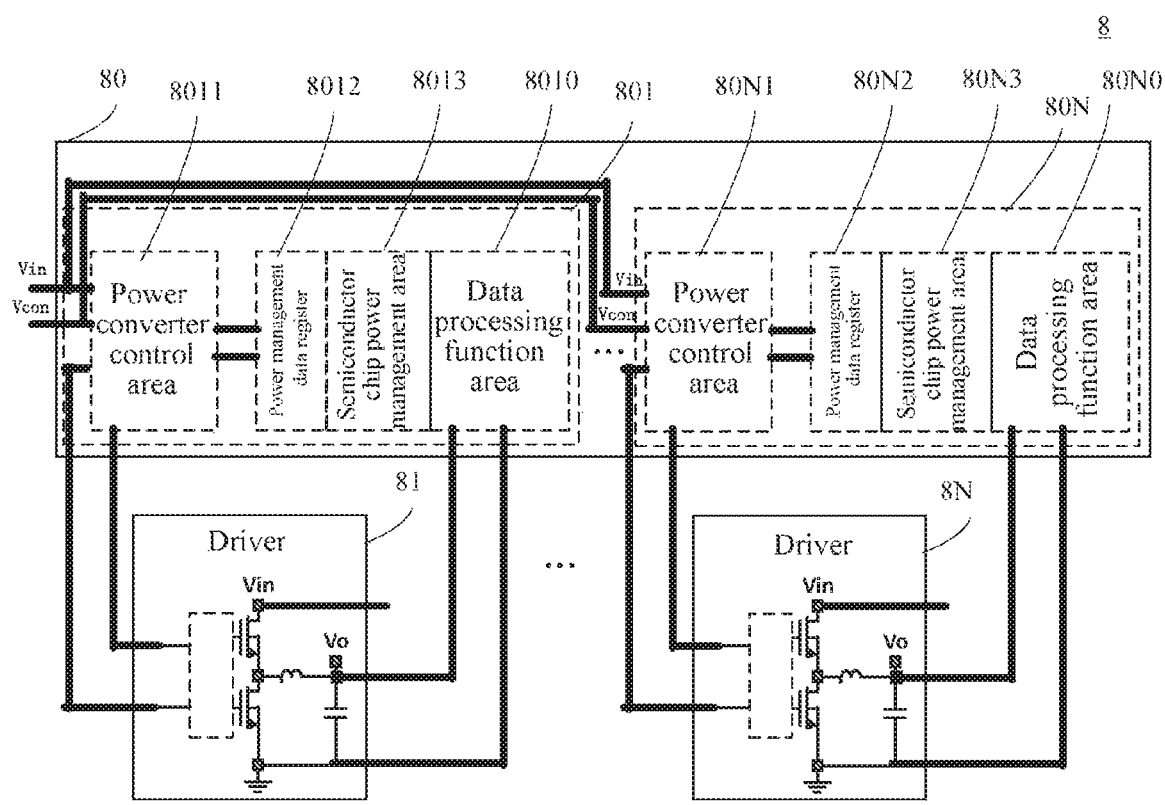
FIG. 10 is a schematic diagram of a semiconductor chip power supply system according to a sixth embodiment of the present disclosure.

Because of a high level of integration, pin resource of the semiconductor chip is tight. Therefore, the functions of the pins may be integrated as much as possible. As shown in FIG. 10, since the voltage Vcon to be received by the plurality of power converter control areas may be the same, the power supply pins may be integrated and may be connected as needed to the plurality of power converter control areas within the semiconductor chip. Based on the semiconductor chip power supply system 5 shown in FIG. 7, the semiconductor chip power supply system 8 shown in FIG. 10 is improved in that: at least two power converter control areas share the same Vcon pin. Similarly, the Vin pins may also be integrated.

As shown in FIG. 10, the semiconductor chip 80 of the semiconductor chip power supply system 8 is divided into N partitions, i.e., a first semiconductor chip partition 801 to an $N^{th}$ semiconductor chip partition 80N, where N is an integer greater than or equal to 2. Correspondingly, the semiconductor chip power supply system 8 further includes: N power converter power stages 81-8N.

The first semiconductor chip partition 801 includes: a data processing function area 8010 and a power converter control area 8011. Alternatively, the first semiconductor chip partition 801 may further include: a power management data register 8012 and a semiconductor chip power management area 8013. The data processing function area 8010 of the first semiconductor chip partition 801 is powered via the power converter power stage 81. The $N^{th}$ semiconductor chip partition 80N includes: a data processing function area 80N0 and a power converter control area 80N1. Optionally, the $N^{th}$ semiconductor chip partition 80N may further include: a power management data register 80N2 and a semiconductor chip power management area 80N3. The data processing function area 80N0 of the $N^{th}$ semiconductor chip partition 80N is powered via the power converter power stage 8N.

At least two of the power converter control areas 8011 to 80N1 share the same Vcon power supply pin.

Seventh Embodiment

Although in the semiconductor chip, multiple data processing function areas need independent power supply, it is not always necessary for each function area to integrate the power converter control area into the semiconductor chip.

Figure 11:
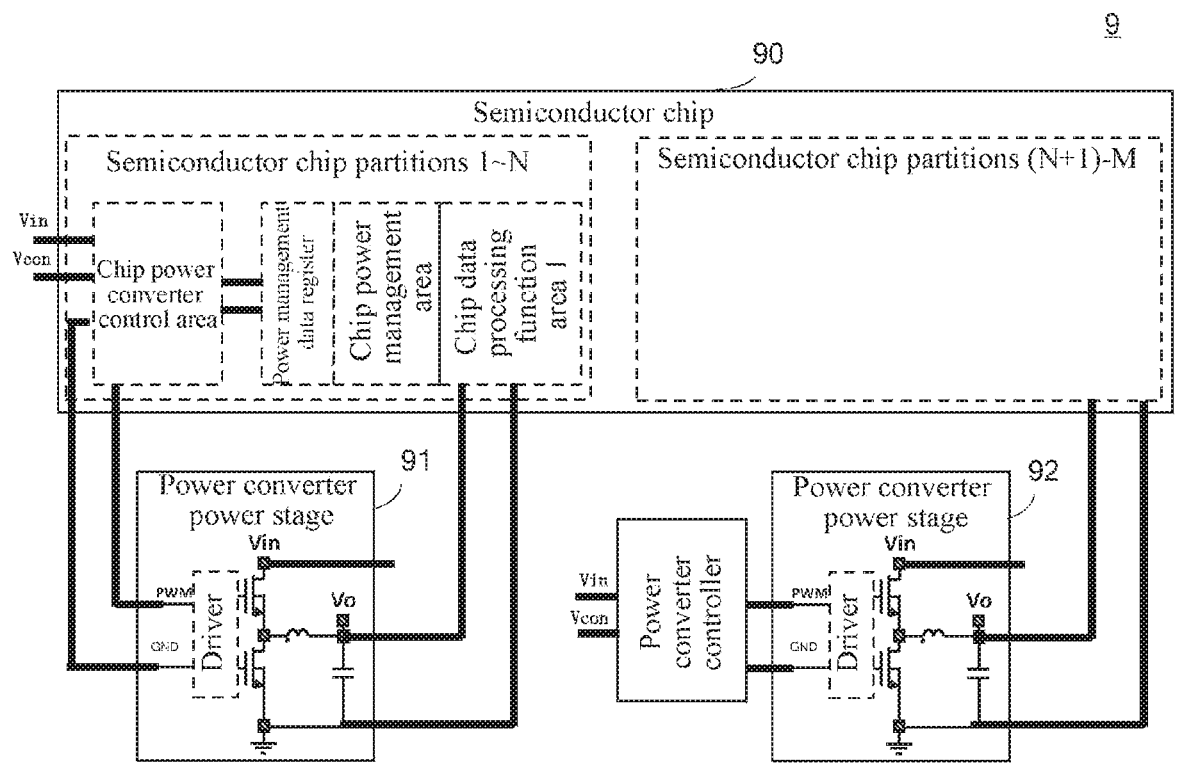
FIG. 11 is a schematic diagram of a semiconductor chip power supply system according to a seventh embodiment of the present disclosure.

As shown in FIG. 11, the semiconductor chip power supply system 9 includes: a semiconductor chip 90 and power converter power stages 91 and 92. The semiconductor chip 90 includes two types of semiconductor chip partitions, one of which is shown in FIGS. 2 to 4 and FIGS. 6 to 10, in which the power converter control area is integrated on the semiconductor chip to belong to the same semiconductor substrate of the semiconductor chip as the data processing function area. The process precision of the semiconductor substrate is high, for example, higher than or equal to 28 nm, such as 14 nm (the smaller the value is, the higher the accuracy is).

Another type is shown in FIG. 1 and FIG. 5. The power converter controller is not located on the semiconductor chip, i.e., the power converter controller and the semiconductor chip are independent. The data processing function area is formed on the semiconductor substrate of the semiconductor chip, but the corresponding power converter power stage and the power converter controller (or called as the power supply control chip) are located outside the semiconductor chip, and the power converter controller is formed on another semiconductor substrate with a lower precision, for example, lower than 28 nm, such as 180 nm. The power converter power stage is electrically connected to the power converter controller and the data processing function area, and the power converter controller controls the power converter power stage to supply power to the data processing function area.

In FIG. 11, M semiconductor chip partitions are illustrated, including the first to the $N^{th}$ first-type semiconductor chip partitions and the $(N+1)^{th}$ to the $M^{th}$ second-type semiconductor chip partitions, where N is an integer greater than or equal to 1, and M>N, that is, the number of each type of the semiconductor chip partitions may be one or more.

As a result, the numbers of the two types of semiconductor chip partitions may be adjusted according to the actual needs so that the power supply can be provided more accurately and efficiently.

Eighth Embodiment

Figure 12:
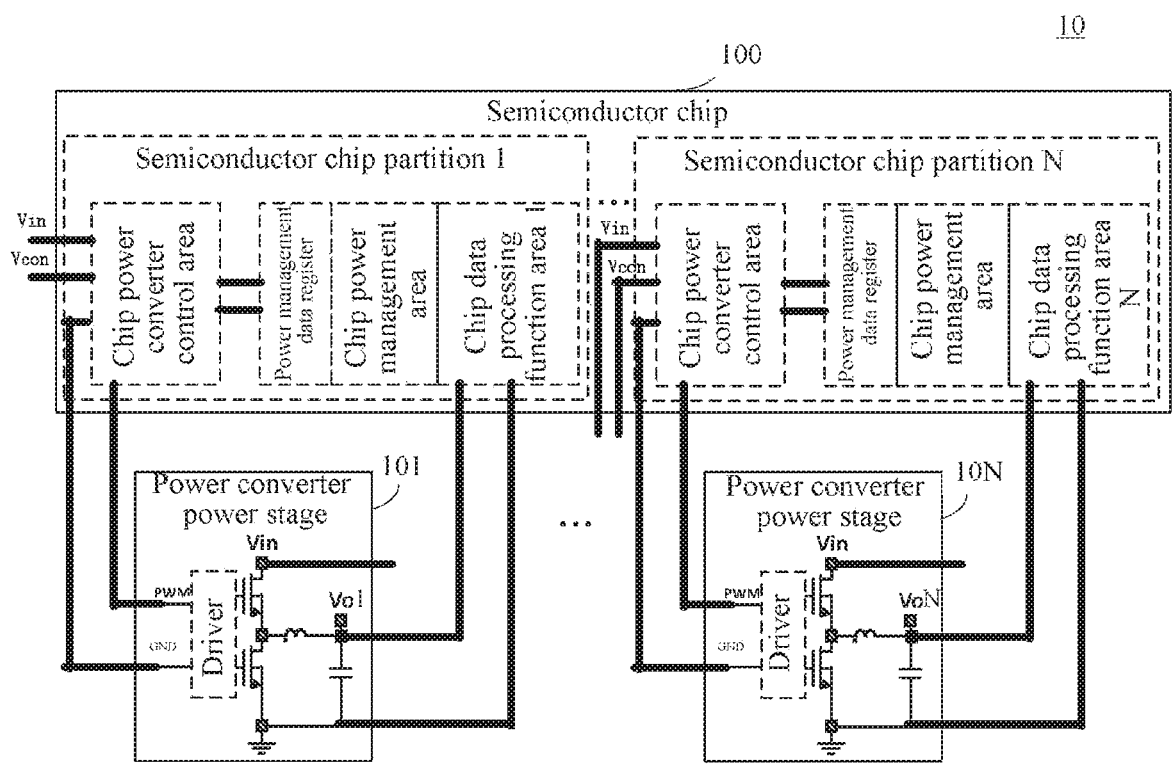
FIG. 12 is a schematic diagram of a semiconductor chip power supply system according to an eighth embodiment of the present disclosure.

As shown in the above FIG. 7 and FIG. 11, the inputs and outputs of individual power converter power stages may also be different, so that a better power stage performance and system layout can be obtained flexibly with respect to the system requirements. Thus, based on FIG. 7 or FIG. 11, in the eighth embodiment, as shown in FIG. 12, there are at least two different Vin voltages in the power converter power stages 101-10N.

Ninth Embodiment

Since some embodiments of the present disclosure are more suitable for applications of high-frequency power converters, in order to achieve the highest possible frequency, an input voltage of the high-frequency converter should be as low as possible. Therefore, in the face of a variety of input occasions, for example, as low as about 3V representative of a single-cell lithium, and up to 400V or even 1200V representative of high-voltage DC bus, a DC-DC converter (for example, a DC-DC buck converter) is used to convert the input voltage to a suitable voltage Vin. For instance, in case of lithium batteries, the voltage is converted into a voltage about 1~1.8V, and in other occasions, the voltage is converted into a voltage less than 8V or even 5V, and may also be converted to a voltage less than 1.8V according to a frequency requirement. When the voltage is between 4~8V, the operating frequency of the power converter is higher than 2 MHZ; when the voltage is between 3~6V, the operating frequency of the power converter is higher than 5 MHZ; and when the voltage is between 1~3V, the operating frequency of the power converter is higher than 10 MHZ, but the present disclosure is not limited thereto.

Figure 13:
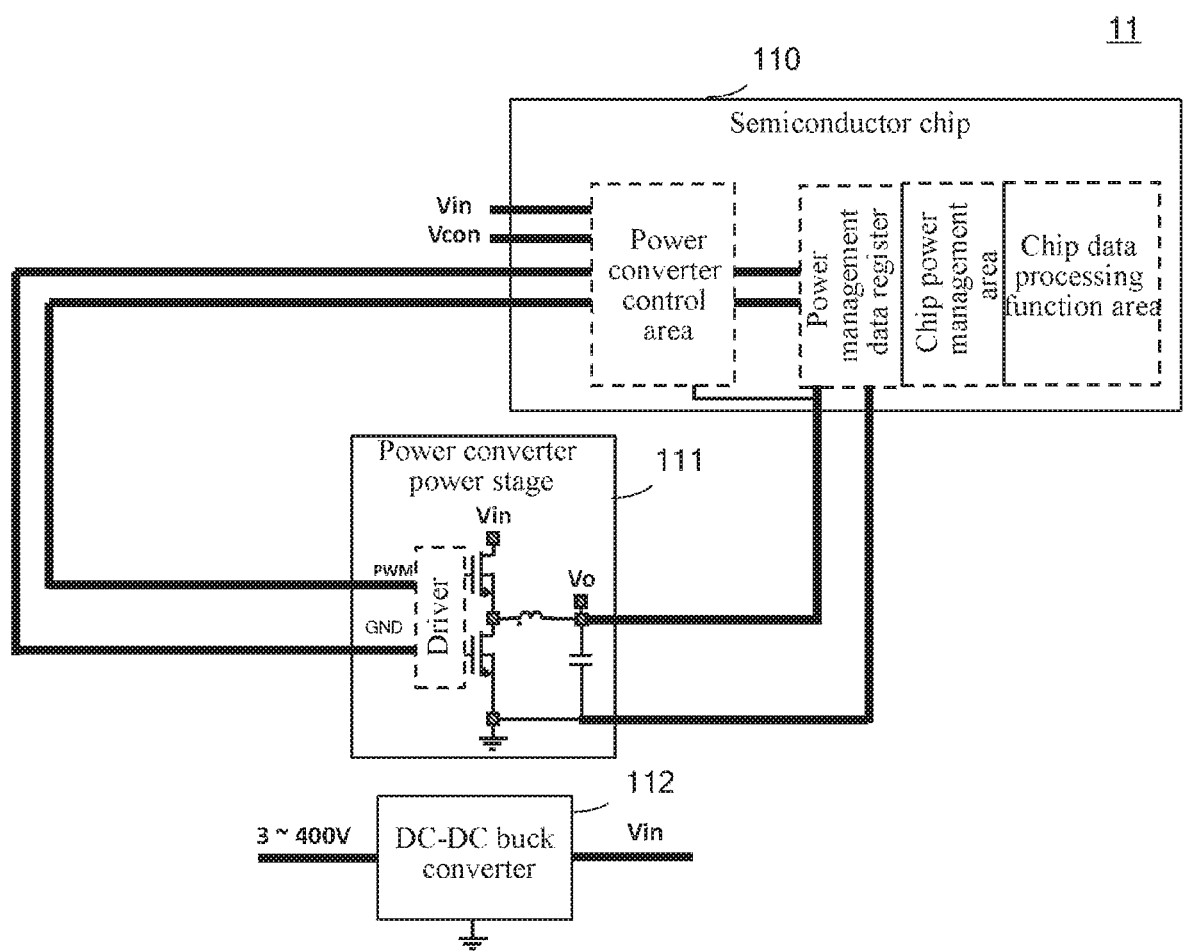
FIG. 13 is a schematic diagram of a semiconductor chip power supply system according to a ninth embodiment of the present disclosure.

As shown in FIG. 13, the semiconductor chip power supply system 11 includes: a semiconductor chip 110 and a power converter power stage 111. The structure of the semiconductor chip power supply system 11 may be the same as or similar to that of the above embodiment, and thus will not be repeated here. The semiconductor chip power supply system 11 further includes: a DC-DC converter 112 for converting the input voltage and outputting an appropriate output voltage Vin to the power converter power stage 111. The DC-DC converter is electrically connected to an input terminal of the power converter power stage.

The DC-DC buck converter in the ninth embodiment may be applied to the above first to eighth embodiments.

Tenth Embodiment

The physical placing position of the power converter power stage in a semiconductor chip power supply system will be described below with reference to FIGS. 14-17.

Figure 14:
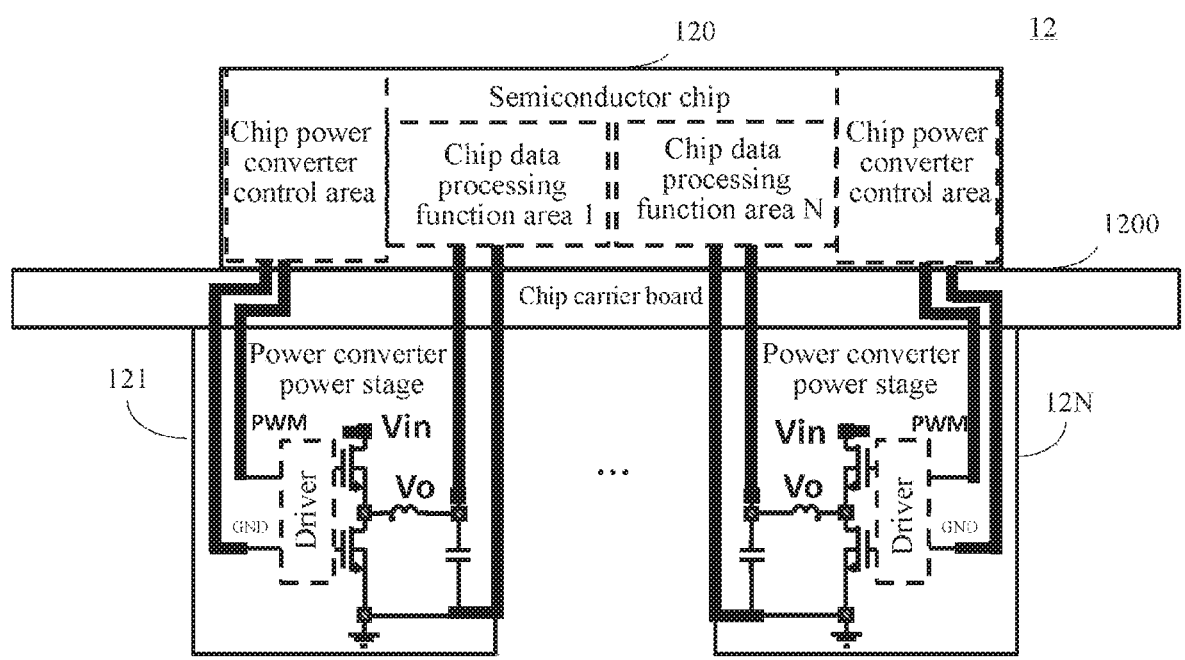
FIGS. 14-17 are schematic diagrams showing physical placing positions of the power converter power stage in the semiconductor chip power supply system according to an embodiment of the present disclosure.
Figure 15:
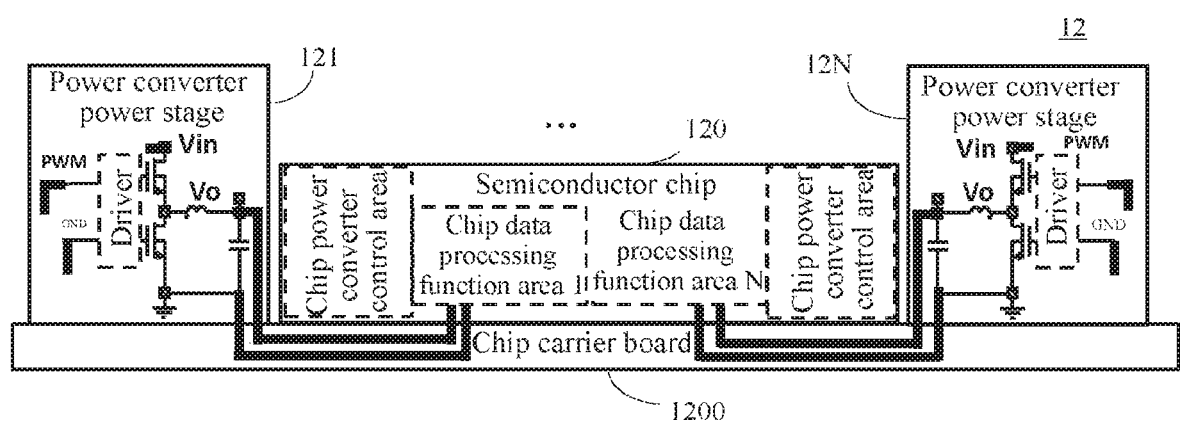

As shown in FIG. 14 and FIG. 15, in order to exert the characteristic of high frequency and fast response of the present disclosure, the power converter power stage may be placed as close as possible to the semiconductor chip.

The semiconductor chip power supply system 12 includes a semiconductor chip 120 including chip data processing function areas 1-N and a chip power converter control area. The semiconductor chip 120 is placed on a chip carrier board 1200. The semiconductor chip power supply system 12 also includes power converter power stages 121-12N. The power converter power stages 121-12N are placed against the chip carrier board 1200 of the semiconductor chip.

The power converter power stages 121-12N may be placed directly below a main power/electricity consumption function area according to a distribution of the main electrical function areas of the semiconductor chip 120, for example, the power converter power stages 121-12N are placed directly below the data processing function area (as shown in FIG. 14). Alternatively, the power converter power stages 121-12N may be placed in the vicinity of the main electrical function area in the same plane as the semiconductor chip (as shown in FIG. 15), thereby shortening a power supply distance.

Figure 16:
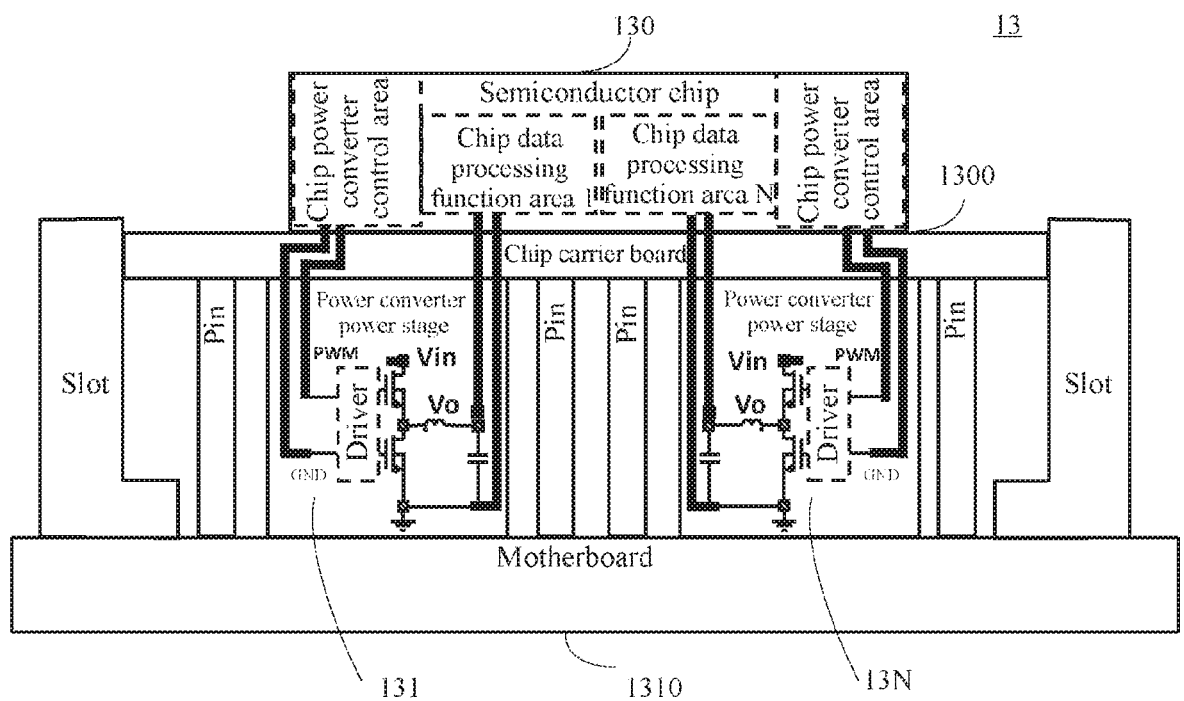
Figure 17:
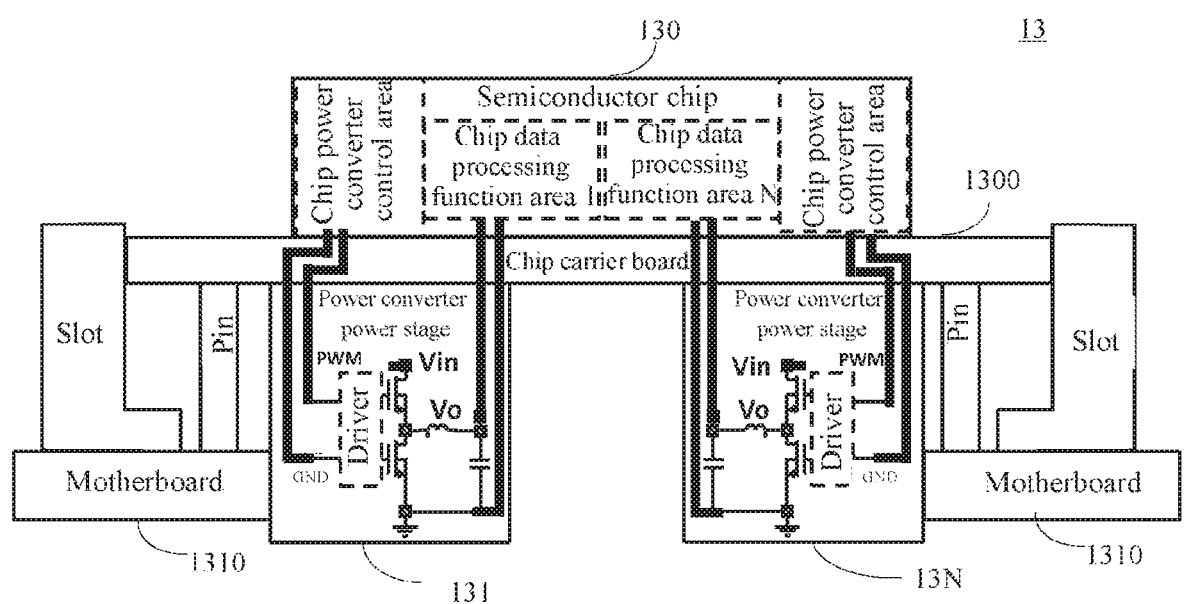

The embodiment of FIG. 14 may be expanded into embodiments shown in FIGS. 16 and 17 according to a mounting method of the semiconductor chip and a size of a motherboard on which the semiconductor chip is carried. In FIG. 16, the power converter power stages 131-13N may be mounted in slots of the semiconductor chip 130, i.e., the power converter power stage may be placed between the chip carrier board 1300 of the semiconductor chip 130 and the motherboard 1310. In this way, a space between the semiconductor chip 130 and the motherboard 1310 is utilized, thereby improving the utilization ratio of the motherboard 1310 and reducing the area occupied by the power supply on the motherboard 1310. The pins may be used for the electrical connection between the chip carrier board 1300 and the motherboard 1310. In addition, because the efficiency of the power converter power stage is related to its size, increasing the size may increase its efficiency. Therefore, if the power converter power stage may be placed through the motherboard, the cooling condition can be improved, the large size of the power converter power stage can be allowed, and its conversion efficiency can be improved. As shown in FIG. 17, in the semiconductor chip power supply system 13, the semiconductor chip 130 is carried on the semiconductor chip carrier board 1300, and the semiconductor chip carrier board 1300 is plugged on the motherboard 1310. The power converter power stages 131-13N may be mounted through the motherboard 1310 under the chip carrier hoard 1300 of the semiconductor chip 130.

Eleventh Embodiment

For a high-power semiconductor chip, an instantaneous change of current consumption is very large, so more high-frequency capacitors, such as MIM (metal-insulator-metal) capacitors, are needed to filter out high-frequency current disturbances. In the current practice, the MIM capacitor is integrated inside the semiconductor chip using a high-precision process. According to the present disclosure, the MIM capacitor may be integrated in the power converter power stage.

Figure 18:
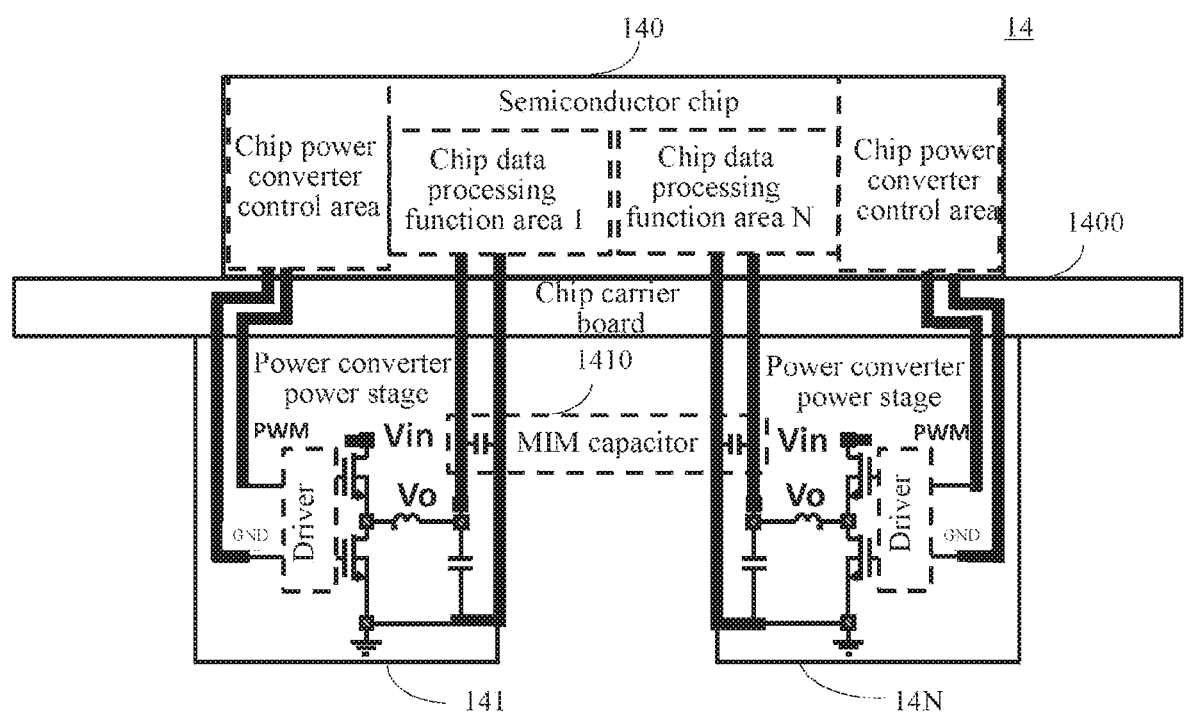
FIG. 18 is a schematic diagram of integrating a MIM capacitor inside the semiconductor chip according to an embodiment of the present disclosure.

As shown in FIG. 18, in the semiconductor chip power supply system 14, the semiconductor chip 140 is placed on the chip carrier board 1400, and the power converter power stages 141 to 14N are placed in close contact with the chip carrier board 1400 of the semiconductor chip. The MIM capacitor integrated inside the power converter power stages 141 to 14N, By integrating the high-frequency capacitor in the power converter power stages, for example, a resonant frequency of the capacitor is above 2 MHz, the cost of the semiconductor chip can be reduced.

Twelfth Embodiment

Figure 19:
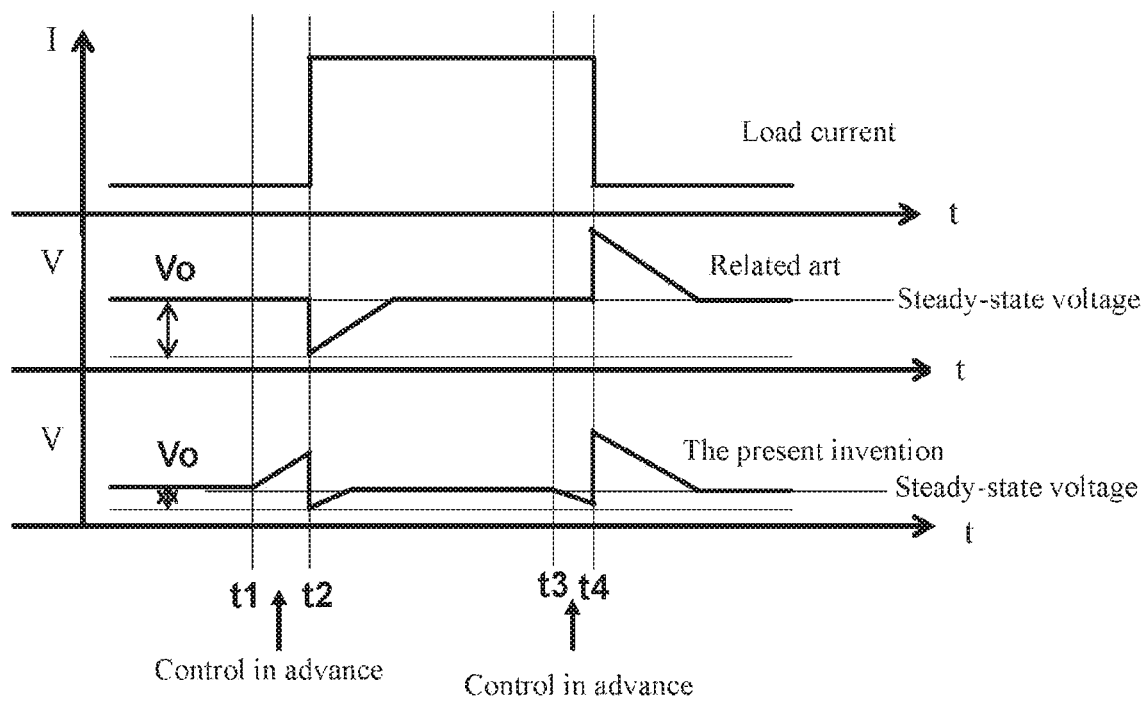
FIG. 19 is a schematic diagram of controlling an output voltage of the power converter in advance according to an embodiment of the present disclosure.

Under the challenge of increasing instantaneous current consumption of the semiconductor chip, the low dynamic voltage variation can be achieved by using the control method shown in FIG. 19 by taking advantage of the high-speed communication and high-frequency processing capability of the embodiments of the present disclosure. The principle of operation is that when the semiconductor chip receives a data processing task, the semiconductor chip power management area predicts a voltage change according to the data processing task and adjusts an output voltage Vo of the power converter power stage in advance through high-frequency communication, so as to reduce an amplitude of the output voltage drop and overshoot caused by the current dynamics.

In the structures of the semiconductor chip power supply systems described above, the control method shown in FIG. 19 may be utilized. After receiving information that the data processing function area is going to change the consumed current, the semiconductor chip power management area provides the control parameter(s) to the power converter control area so as to, before the current consumed by the data processing function area actually changes, make the power converter control area control an output voltage of the first power converter power stage to be adjusted, and make a direction of adjustment of the output voltage of the power converter power stage be opposite to the direction of change of the output voltage of the power converter power stage due to the change of the current consumed by the data processing function area.

Taking FIG. 19 as an example, after a data processing task is received by the semiconductor chip, at a moment t1 before a moment t2 at which the consumed current increases, by communicating with the control area, the output voltage Vo is increased before the moment t2. At the end of processing task, at a moment t3 before a moment t4 at which the consumed current decreases, by communicating with the control area, the output voltage Vo is reduced before the moment t4. Compared with the related art, the voltage drop and overshoot caused by the drastic changes of the current consumed by the semiconductor chip, that is, the load current, will be small.

That is, before the current consumed by the semiconductor chip changes, the output voltage of the power converter is controlled to be adjusted such that the voltage peak/valley due to the current change is closer to a the steady-state voltage.

Although the present disclosure has been described above in detail by way of exemplary embodiments, the scope of the present disclosure is not limited to the above embodiments, and various improvements and modifications may be made to the present disclosure by those skilled in the art without departing from the scope and spirit of the present disclosure.

What is claimed is:

1. A semiconductor chip power supply system, comprising:
    a semiconductor chip comprising: a first data processing function area and a first power converter control area, the first data processing function area and the first power converter control area being formed on a first semiconductor substrate of the semiconductor chip; and
    a first power converter power stage located outside the first semiconductor substrate and electrically connected to the first power converter control area and the first data processing function area;
    wherein the first power converter control area controls the first power converter power stage to supply power to the first data processing function area, and the first power converter control area receives a signal of an output voltage of the first power converter power stage and adjusts an output voltage of the first power converter power stage according to a working frequency of the first data processing function area;
    wherein the first power converter power stage comprises: at least a switch, a driver and at least a passive device.

2. The semiconductor chip power supply system according to claim 1, wherein the semiconductor chip comprises: a drive signal sending pin, the first power converter control area sends a drive signal to the driver via the drive signal sending pin, the driver drives the switch according to the drive signal, and the switch cooperates with the passive device to supply power to the first data processing function area.

3. The semiconductor chip power supply system according to claim 1, wherein the first power converter power stage comprises: a multi-phase paralleled buck circuit or a switched capacitor circuit.

4. The semiconductor chip power supply system according to claim 2, wherein the first power converter power stage comprises: a working status signal sending pin for sending a working status signal of the first power converter power stage to the first power converter control area, and the semiconductor chip comprises: a working status signal receiving pin for receiving the working status signal and transmitting the working status signal to the first power converter control area inside the semiconductor chip.

5. The semiconductor chip power supply system according to claim 4, wherein the drive signal sending pin and the working status signal receiving pin are multiplexed.

6. The semiconductor chip power supply system according to claim 1, wherein the semiconductor chip comprises: a first power supply pin and a second power supply pin, the first power supply pin is electrically connected to the first data processing function area and receives a first voltage provided by the first power converter power stage to supply power to the first data processing function area, and the second power supply pin is electrically connected to the first power converter control area and receives a second voltage to supply power to the first power converter control area.

7. The semiconductor chip power supply system according to claim 6, wherein the first power supply pin is further electrically connected to the first power converter control area, and when the first voltage is greater than a threshold value, the first voltage of the first power supply pin is used to supply power to the first power converter control area instead of the second voltage of the second power supply pin.

8. The semiconductor chip power supply system according to claim 1, wherein the semiconductor chip further comprises: a first power management data register and a first semiconductor chip power management area, the first power management data register is electrically connected to the first semiconductor chip power management area, the first power management data register is electrically connected to the first power converter control area, the first semiconductor chip power management area provides a control parameter required by the first power converter control area and stores the control parameter into the first power management data register, and the first power converter control area adjusts a power output of the first power converter power stage by reading the control parameter in the first power management data register.

9. The semiconductor chip power supply system according to claim 1, wherein the number of the first data processing function areas is N, and each of the first data processing function areas is electrically connected to the first power supply pin, N being greater than or equal to 2.

10. The semiconductor chip power supply system according to claim 6, wherein the semiconductor chip further comprises: a second data processing function area and a second power converter control area, the second data processing function area and the second power converter control area are formed on the first semiconductor substrate of the semiconductor chip; and the semiconductor chip power supply system further comprises: a second power converter power stage located outside the first semiconductor substrate and electrically connected to the second power converter control area and the second data processing function area;

wherein the second power converter control area controls the second power converter power stage to supply power to the second data processing function area.

11. The semiconductor chip power supply system according to claim 10, wherein the semiconductor chip comprises: a third power supply pin and a fourth power supply pin, the third power supply pin is electrically connected to the second data processing function area and receives a third voltage provided by the second power converter power stage to supply power to the second data processing function area, and the fourth power supply pin is electrically connected to the second power converter control area and receives a fourth voltage to supply power to the second power converter control area.

12. The semiconductor chip power supply system according to claim 11, wherein the first voltage is different from the third voltage, or the second voltage is different from the fourth voltage, or the first voltage is different from the third voltage and the second voltage is different from the fourth voltage.

13. The semiconductor chip power supply system according to claim 10, wherein the semiconductor chip comprises: a third power supply pin, the third power supply pin is electrically connected to the second data processing function area and receives a third voltage provided by the second power converter power stage to supply power to the second data processing function area, and the second power supply pin is further electrically connected to the second power converter control area to supply power to the second power converter control area.

14. The semiconductor chip power supply system according to claim 10, wherein the semiconductor chip further comprises: a second power management data register and a second semiconductor chip power management area, the second power management data register is electrically connected to the second semiconductor chip power management area, the second power management data register is electrically connected to the second power converter control area, the second semiconductor chip power management area provides a control parameter required by the second power converter control area and stores the control parameter into the second power management data register, and the second power converter control area adjusts a power output of the second power converter power stage by reading the control parameter in the second power management data register.

15. The semiconductor chip power supply system according to claim 10, wherein the semiconductor chip further comprises: a first power management data register and a first semiconductor chip power management area, the first power management data register is electrically connected to the first semiconductor chip power management area, the first power management data register is electrically connected to the first power converter control area and the second power converter control area, the first semiconductor chip power management area provides control parameters required by the first power converter control area and the second power converter control area and stores the control parameters into the first power management data register, and the first power converter control area and the second power converter control area respectively adjust power outputs of the first power converter power stage and the second power converter power stage by reading the control parameters in the first power management data register.

16. The semiconductor chip power supply system according to claim 1, wherein the semiconductor chip further comprises: a second data processing function area formed on the first semiconductor substrate of the semiconductor chip;

the semiconductor chip power supply system further comprises: a second power converter power stage located outside the first semiconductor substrate and a power supply control chip formed on a second semiconductor substrate, the second power converter power stage being electrically connected to the power supply control chip and the second data processing function area;

wherein the power supply control chip controls the second power converter power stage to supply power to the second data processing function area.

17. The semiconductor chip power supply system according to claim 16, wherein a process precision of the semiconductor chip is higher than or equal to 28 nm, and a process precision of the power supply control chip is lower than 28 nm.

18. The semiconductor chip power supply system according to claim 1, wherein the first power converter power stage is mounted in a slot of the semiconductor chip.

19. The semiconductor chip power supply system according to claim 1, wherein the semiconductor chip is carried on a semiconductor chip carrier board, the semiconductor chip carrier board is plugged on a motherboard, and the first power converter power stage is disposed to contact to the semiconductor chip carrier board.

20. The semiconductor chip power supply system according to claim 19, wherein the first power converter power stage is mounted between the semiconductor chip carrier board and the motherboard.

21. The semiconductor chip power supply system according to claim 19, wherein the first power converter power stage penetrates through the motherboard and is mounted below the semiconductor chip carrier board.

22. The semiconductor chip power supply system according to claim 1, further comprising: a high frequency capacitor integrated in the first power converter power stage, the high frequency capacitor having a resonant frequency greater than or equal to 2 MHz.

23. The semiconductor chip power supply system according to claim 8, wherein the first semiconductor chip power management area, after receiving information that the first data processing function area is to change consumed current, provides the control parameter to the first power converter control area, so that the first power converter control area controls the output voltage of the first power converter power stage to be adjusted before the current consumed by the first data processing function area changes, and an adjustment direction of the output voltage of the first power converter power stage is opposite to a change direction of the output voltage of the first power converter power stage due to the change of the current consumed by the first data processing function area.

24. The semiconductor chip power supply system according to claim 1, wherein a highest operation frequency of the semiconductor chip is greater than or equal to 500 MHz.

25. The semiconductor chip power supply system according to claim 1, further comprising: a direct current-direct current converter electrically connected to an input end of the first power converter power stage.

26. The semiconductor chip power supply system according to claim 1, wherein a process precision of the semiconductor chip is higher than or equal to 28 nm.

27. The semiconductor chip power supply system according to claim 26, wherein the semiconductor chip power supply system has a startup sequence as below: the first power converter control area is supplied with a required voltage Vcon, after initiation of the first power converter control area, an input voltage to the first power converter power stage Vin is being detected, and when it is detected that the input voltage to the first power converter power stage enters into a pre-defined range, the first power converter control area controls the first power converter power stage to supply power Vo to other parts of the semiconductor chip besides the first power converter control area.

* * * * *